(12) United States Patent
Horner et al.

(10) Patent No.: US 10,417,136 B2
(45) Date of Patent: Sep. 17, 2019

(54) WRITE-THROUGH DETECTION FOR A MEMORY CIRCUIT WITH AN ANALOG BYPASS PORTION

(71) Applicants: Jeremy William Horner, Nottingham, MD (US); Quentin P. Herr, Ellicott City, MD (US)

(72) Inventors: Jeremy William Horner, Nottingham, MD (US); Quentin P. Herr, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/851,264

(22) Filed: Dec. 21, 2017

(65) Prior Publication Data
US 2019/0196973 A1    Jun. 27, 2019

(51) Int. Cl.
*G06F 12/0888* (2016.01)
*H01L 39/22* (2006.01)
(Continued)

(52) U.S. Cl.
CPC ...... *G06F 12/0888* (2013.01); *G06F 12/0207* (2013.01); *G06F 15/8038* (2013.01);
(Continued)

(58) Field of Classification Search
CPC ............ G06F 12/0888; G06F 12/0207; G06F 15/8038; G06N 10/00; G11C 8/08;
(Continued)

(56) References Cited

U.S. PATENT DOCUMENTS 9,384,827 B1    7/2016 Reohr
9,443,576 B1 *  9/2016 Miller .................... G11C 11/44
(Continued)

FOREIGN PATENT DOCUMENTS

EP    3266024 A1    1/2018
EP    3350808 A2    7/2018
(Continued)

OTHER PUBLICATIONS

Canadian Office Action corresponding to Canadian Patent Application No. 2996621, dated Dec. 12, 2018.
(Continued)

*Primary Examiner* — Jerome Leboeuf
(74) *Attorney, Agent, or Firm* — Tarolli, Sundheim, Covell & Tummino LLP (57) ABSTRACT

The circuit includes a memory array arranged as rows and columns of memory cells. An array portion stores a respective memory word in a given one of the rows in response to a word-write signal corresponding to a write address of the given one of the rows and in response to a plurality of bit-write signals associated with the plurality of columns, and reads a respective memory word from a given one of the rows in response to a word-read signal corresponding to a read address of the given one of the rows and in response to a plurality of bit-read signals associated with the plurality of columns. The circuit also includes a write-through detection system that activates an analog bypass portion to read the memory word from the analog bypass portion in response to the read address being the same as the write address.

20 Claims, 3 Drawing Sheets

(51) Int. Cl.
| | |
|---|---|
| *G06N 10/00* | (2019.01) |
| *G11C 7/10* | (2006.01) |
| *G11C 11/44* | (2006.01) |
| *G11C 8/14* | (2006.01) |
| *G06F 15/80* | (2006.01) |
| *G11C 11/419* | (2006.01) |
| *G11C 8/08* | (2006.01) |
| *G06F 12/02* | (2006.01) |

(52) U.S. Cl.
CPC ........... *G06N 10/00* (2019.01); *G11C 7/1012* (2013.01); *G11C 8/08* (2013.01); *G11C 8/14* (2013.01); *G11C 11/419* (2013.01); *G11C 11/44* (2013.01); *H01L 39/223* (2013.01)

(58) Field of Classification Search
CPC ..... G11C 11/419; G11C 11/44; G11C 7/1012; G11C 8/14; H01L 39/223
See application file for complete search history.

(56) References Cited

U.S. PATENT DOCUMENTS

| | | | |
|---|---|---|---|
| 9,520,181 B1 | 12/2016 | Miller | |
| 9,761,305 B2 | 9/2017 | Reohr | |
| 9,779,803 B1 | 10/2017 | Konigsburg | |
| 2006/0171190 A1 | 8/2006 | Kawasumi | |
| 2008/0175086 A1 | 7/2008 | Luk | |
| 2009/0303807 A1 | 12/2009 | Lee | |
| 2010/0110803 A1* | 5/2010 | Arai | G11C 7/1006 365/189.05 |
| 2011/0122675 A1 | 5/2011 | Parkinson | |
| 2012/0184445 A1 | 7/2012 | Mukhanov et al. | |
| 2015/0043273 A1 | 2/2015 | Naaman et al. | |
| 2015/0094207 A1* | 4/2015 | Herr | H01L 27/18 505/171 |

FOREIGN PATENT DOCUMENTS

| | | |
|---|---|---|
| JP | 2013529380 | 7/2013 |
| JP | 2015525426 | 9/2015 |
| KR | 101801901 | 11/2017 |
| WO | 2013180946 | 12/2013 |
| WO | 2015050621 | 4/2015 |
| WO | 20160140889 A1 | 9/2016 |
| WO | 2017091258 A2 | 6/2017 |

OTHER PUBLICATIONS

Baek, B. et al, Hybrid superconducting-magnetic memory device using competing order parameters, Nature Communications, vol. 5, May 2014.
Korean Office Action corresponding to Korean Application No. 10 2017 7025552 dated Mar. 5, 2019.
Cini et al., "Magnetically induced pumping and memory storage in quantum rings", American Physical Society (APS), Physical Review B—Condensed Matter and Materials Physics, vol. 84, Issue 24, pp. 245201-1-245201-5, Dec. 8, 2011 (Dec. 8, 2011) [retrieved on Jun. 19, 2018 (Jun. 19, 2017) from: https://journals.aps.org/prb/Abstract/ 10.1103 PhysRevB.84.245201, also available at: https://arxiv.org/ pdf/1112.0140.pdf ].
Canadian Office Action corresponding to Canadian Patent Application No. 2,977,378 dated Jun. 21, 2018.
Japanese Office Action corresponding to Japanese Patent Application No. 2018-533039 dated Mar. 5, 2019.
International Search Report and Written Opinion corresponding to International Application No. PCT/US2018/064320 dated Mar. 3, 2019.

* cited by examiner

WRITE-THROUGH DETECTION FOR A MEMORY CIRCUIT WITH AN ANALOG BYPASS PORTION

TECHNICAL FIELD

This disclosure relates generally to classical and quantum computing systems, and more specifically to a memory circuit with an analog bypass portion.

BACKGROUND

Memory is a fundamental aspect of computing technology. The ability to store data in random-access memory (RAM) is essential to the capability of a computer to perform calculations, particularly in an ever increasing demand of faster computational speeds. RAM is a form of computer data storage which stores frequently used program instructions and program data to increase the general speed of a system. A RAM device allows data items to be read or written in almost the same amount of time irrespective of the physical location of data inside the memory. Typically, a given RAM is arranged as an array of rows and columns that are accessed by peripheral circuitry to write data to a particular row in a write operation, and to subsequently read the data from the row in a read operation. As an example, superconducting digital technology has provided computing and/or communications resources that benefit from unprecedented high speed, low power dissipation, and low operating temperature. For decades, superconducting digital technology has lacked RAM with adequate capacity and speed relative to logic circuits.

SUMMARY

One example includes a memory circuit. The circuit includes a memory array arranged as rows and columns of memory cells. An array portion stores a respective memory word in a given one of the rows in response to a word-write signal corresponding to a write address of the given one of the rows and in response to a plurality of bit-write signals associated with the plurality of columns, and reads a respective memory word from a given one of the rows in response to a word-read signal corresponding to a read address of the given one of the rows and in response to a plurality of bit-read signals associated with the plurality of columns. The circuit also includes a write-through detection system that activates an analog bypass portion to read the memory word from the analog bypass portion in response to the read address being equal to the write address.

Another example includes a method for reading data from a memory array during a write operation. The memory array includes rows and columns of memory cells. The method includes providing a write address signal corresponding to a write address of the given one of the rows and providing a word-write signal associated with the write address via a write address decoder to activate the respective one of the rows during a write operation. The method also includes providing a plurality of bit-write signals associated with the respective columns of the memory array to store a memory word in the respective one of the rows during the write operation and providing a read address signal corresponding to a read address of a respective one of the rows during the write operation. The method also includes comparing the read address signal and the write address signal and activating an analog bypass portion of the memory array in response to the read address signal being equal to the write address signal. The method further includes reading the memory word from the analog bypass portion of the memory array in response to activation of the analog bypass portion.

Another example includes a memory circuit. The circuit includes a memory array comprising an array portion and an analog bypass portion. The array portion includes rows and columns of memory cells. Each of the memory cells includes a superconducting hysteretic memory element and each of a plurality of cells of the analog bypass portion comprising a superconducting read element, the array portion storing a respective memory word in a given one of the rows in response to a word-write signal corresponding to a write address of the given one of the rows and in response to a plurality of bit-write signals associated with the plurality of columns, and to read a respective memory word from a given one of the rows in response to a word-read signal corresponding to a read address of the given one of the rows and in response to a plurality of bit-read signals associated with the plurality of columns. The system further includes a write-through detection system that activates the analog bypass portion to read the plurality of bit-write signals corresponding to the memory word from the analog bypass portion in response to the read address being equal to the write address.

DETAILED DESCRIPTION

This disclosure relates generally to classical and quantum computing systems, and more specifically to a memory circuit with an analog bypass portion. The memory circuit includes an array of memory cells arranged in contiguous rows and columns. The array of memory cells of the memory circuit are arranged as including an array portion and an analog-bypass portion. The array portion includes the memory cells arranged in a set of rows and columns, and is configured to store a memory word in a given one of the rows in response to a word-write signal corresponding to a write address of the given one of the rows and in response to a plurality of bit-write signals associated with the plurality of columns during a write operation. The array portion is also configured to facilitate reading a respective memory word from a given one of the rows in response to a word-read signal corresponding to a read address of the given one of the rows and in response to a plurality of bit-read signals associated with the plurality of columns during a read operation. The memory circuit also includes a write-through detection system that activates the analog bypass portion to read the memory word from the analog bypass portion in response to the read address being equal to the write address, such as during a write operation.

As an example, during a write operation, the write-through detection system can compare a write address signal corresponding to the write address and a read address signal corresponding to a read address that may be received at approximately the same time. In response to detecting that the write address and the read address are the same (e.g., corresponding to the same row, such as based on the write and read address signals being approximately the same), the write-through detection system can command deactivation of an associated read address decoder to prohibit the read address decoder from reading the row corresponding to the read address signal. Additionally, the write-through detection system can command activation of the analog bypass portion, such as by providing a write-through detection signal to the analog bypass portion. Thus, the analog bypass portion can read the memory word based on reading the bit-write signals that are provided through the cells of the analog bypass portion. Accordingly, the memory circuit can allow reading a memory word approximately concurrently with the writing of the respective memory word to the memory array.

Figure 1:
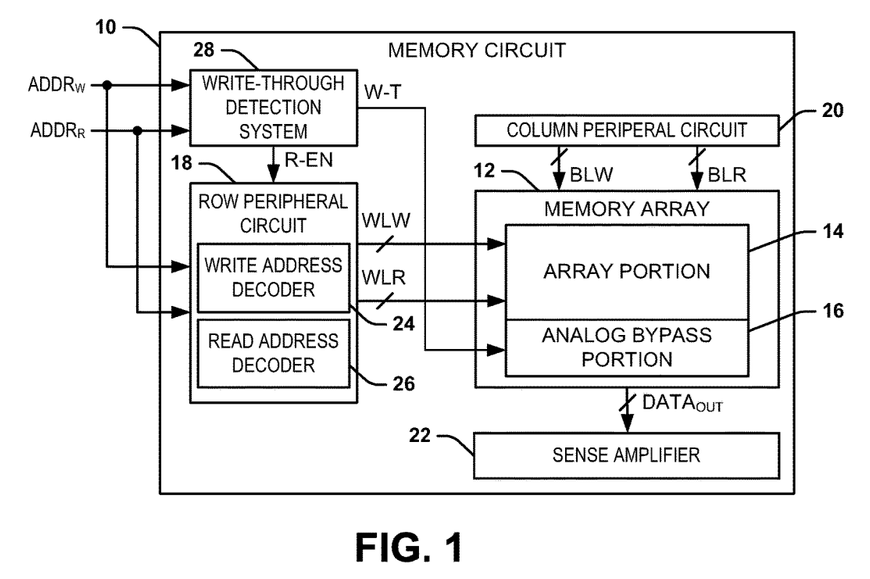
FIG. 1 illustrates an example of a memory circuit.

FIG. 1 illustrates an example of a memory circuit 10. The memory circuit 10 can be implemented in any of a variety of computer systems, such as a quantum computer system. For example, the memory circuit 10 can be implemented in a reciprocal quantum logic (RQL) computer system.

The memory circuit 10 includes a memory array 12 that is demonstrated as including an array portion 14 and an analog bypass portion 16. The array portion 14 includes memory cells that are arranged in an array of rows and columns. Each of the rows of the array portion 14 is configured to store a data word during a write operation in response to a word-write signal WLW that is generated from a row peripheral circuit 18 and selects the respective row for writing, and a plurality of bit-write signals BLW that are generated from a column peripheral circuit 20 and are each associated with a respective column of the array portion 14. As an example, the bit-write signals BLW can sequentially propagate through the rows from the column peripheral circuit 20. The data that is stored in the array portion 14 can be accessed during a read operation in response to a word-read signal WLR that is generated from the row peripheral circuit 18 and selects the respective row for reading, and a plurality of bit-read signals BLR that are generated from the column peripheral circuit 20. Accordingly, a data word that is read from a respective row of the array portion 12 that is selected via a word-read signal WLR can be provided as output data $DATA_{OUT}$ in response to the bit-read signals BLR. In the example of FIG. 1, the output data $DATA_{OUT}$ is provided to a sense amplifier 22 that is configured to provide the output data $DATA_{OUT}$ as the memory word that is read from the associated row of the array portion 14. As an example, the output data $DATA_{OUT}$ can correspond to the set of bit-read signals BLR in either a voltage state or a non-voltage state, as described in greater detail herein.

In the example of FIG. 1, the memory circuit 10 receives a write address signal $ADDR_W$ corresponding to a write address, and thus corresponding row, of the array portion 14 to which a memory word is to be written during the write operation. Similarly, the memory circuit 10 receives a read address signal $ADDR_R$ corresponding to a read address, and thus corresponding row, of the array portion 14 from which a memory word is to be read during the read operation. The row peripheral circuit 18 includes a write address decoder 24 that is configured to determine the write address from the write address signal $ADDR_W$ and to provide the word-write signal WLW to the associated row during the write operation to activate the respective row of the array portion 14 for writing the respective memory word to the respective row via the bit-write signals BLW. Similarly, the row peripheral circuit 18 includes a read address decoder 26 that is configured to determine the read address from the read address signal $ADDR_R$ and to provide the word-read signal WLR to the associated row during the read operation to activate the respective row of the array portion 14 for reading the respective memory word from the respective row via the bit-read signals BLR.

Additionally, the memory circuit 10 includes a write-through detection system 28. As an example, the memory circuit 10 can receive a command to write a memory word to the memory array 12 and a command to read a memory word from the array 12 approximately concurrently in time. For example, an associated processor (not shown) can require access to the data that is requested to be read substantially immediately before or after it commanded storage of the data to the memory circuit 10, such as based on addressing stored in a content addressable memory (CAM). If the memory word that is to be read is stored in a row of the array portion 14 of the memory array 12 to which the same memory word is being written, then a timing error can occur, such as resulting from the memory word that is read having not been completely written to the same row of the array portion 14. Accordingly, such a timing error can result in a data error of the memory word that is read from the row of the array portion 14.

To substantially mitigate timing errors associated with a substantially concurrent write operation and read operation from the same row of the array portion 14, the write-through detection system 28 is configured to likewise receive the write address signal $ADDR_W$ and the read address signal $ADDR_R$. The write-through detection system 28 can thus compare the write address signal $ADDR_W$ and the read address signal $ADDR_R$. In response to the write address signal $ADDR_W$ and the read address signal $ADDR_R$ being unequal, the write-through detection system 28 can provide a read-enable signal R-EN to command the row peripheral circuit 18 to allow access to the respective separate rows corresponding to the write address signal $ADDR_W$ via the word-write signal WLW and the read address signal $ADDR_R$ via the word-read signal WLR. However, if the write-through detection system 28 determines that the write address signal $ADDR_W$ and the read address signal $ADDR_R$ are equal, and thus the row to which the write address signal $ADDR_W$ is commanding a data word to be written is equal to the row from which the read address signal $ADDR_R$ is commanding a data word to be read, the write-through detection system 28 can activate the analog bypass portion 16 via a write-through signal W-T, such that the data word can be read from the analog bypass portion 16 substantially concurrently with the writing of the data word to the row corresponding to the write address signal $ADDR_W$. As an example, the write-through detection system 28 can also de-assert the read-enable signal R-EN to deactivate the read address decoder 26 R-EN to prohibit the read address decoder 26 from generating the word-read signal WLR.

As an example, the analog bypass portion 16 can include a plurality of cells that are arranged substantially similar to the memory cells of the array portion 14, except, as an example, the cells of the analog bypass portion 16 may not include a hysteretic memory element. For example, the memory circuit 10 can be implemented in a quantum or quantum/classical computer system, such that each of the memory cells of the array portion 14 can include a superconducting hysteretic memory element (e.g., a hysteretic magnetic Josephson junction). In the example of a quantum computer system, each of the cells of the analog bypass portion 16 can include a superconducting read element (e.g., a superconducting quantum interference device (SQUID)) that is activated by a write-through signal W-T that is provided by the write-through detection system 28 to activate the analog bypass portion 16.

As an example, the cells of the analog bypass portion 16 can be coupled to bit-write lines on which the bit-write signals BLW are provided. As a result, in response to activation of the analog bypass portion 16 via the write-through signal W-T, the cells of the analog bypass portion 16 can read the memory word that is being written to the row corresponding to the write address signal $ADDR_W$ via the bit-write signals BLW likewise directly from the bit-write signals BLW. In other words, as an example, because the bit-write signals BLW correspond to the memory word that is written to the row corresponding to the write address signal $ADDR_W$, the bit-write signals BLW can likewise be read directly from the analog bypass portion 16 (e.g., via activation by the write-through signal W-T) as the bit-write signals BLW propagate through the memory array 12. Accordingly, the memory word can be read from the memory array 12 substantially concurrently with the writing of the memory word to the memory array 12 in a manner that substantially mitigates the risk of timing errors that can affect the integrity of the memory word. As a result, the memory circuit 10 can operate in a much quicker and more efficient manner by not be required to wait until conclusion of a write operation before initiating a read operation based on allowing a data word to be read from the memory array 12 concurrently with the same data word being written to the memory array 12.

Figure 2:
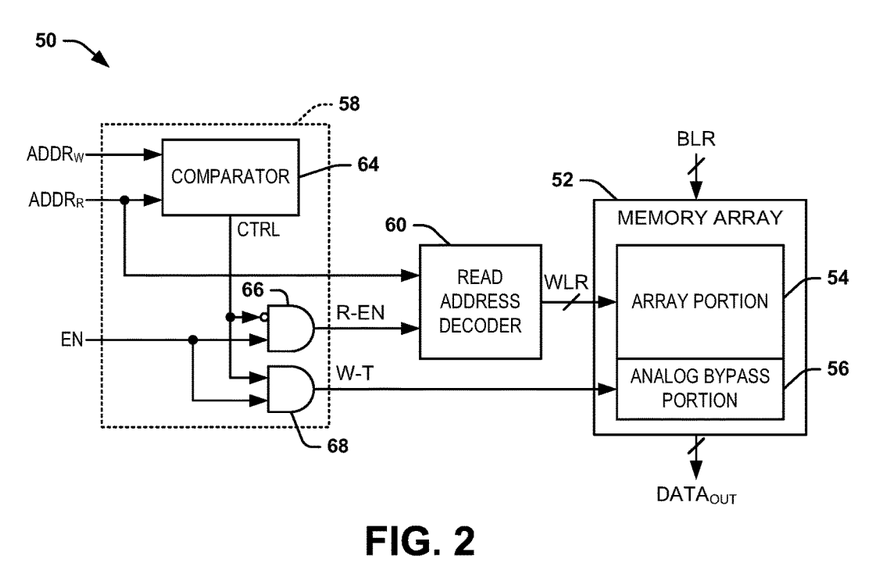
FIG. 2 illustrates another example of a memory circuit.

FIG. 2 illustrates another example of a memory circuit 50. The memory circuit 50 can include components that are included in the memory circuit 10 in the example of FIG. 1. Therefore, reference is to be made to the example of FIG. 1 in the following description of the example of FIG. 2.

The memory circuit 50 includes a memory array 52 that is demonstrated as including an array portion 54 and an analog bypass portion 56. As an example, the memory array 52 can be configured substantially similar to as described previously in the example of FIG. 1. The array portion 54 includes memory cells that are arranged in an array of rows and columns. Each of the rows of the array portion 54 is configured to store a data word during a write operation in response to a word-write signal WLW (not shown) that is generated from the row peripheral circuit (not shown) and selects the respective row for writing, and a plurality of bit-write signals BLW that are generated from a column peripheral circuit (not shown) and are each associated with a respective column of the array portion 54.

In the example of FIG. 2, the memory circuit 50 also includes a write-through detection system 58 that receives a write address signal $ADDR_W$ corresponding to a write address during a write operation and receives a read address signal $ADDR_R$ corresponding to a read address during a read operation. The memory circuit 50 is also demonstrated as including a read address decoder 60, such as arranged as part of a row peripheral circuit, that is configured to determine the read address from the read address signal $ADDR_R$ and to provide the word-read signal WLR to the associated row during the read operation to activate the respective row of the array portion 54 for reading the respective memory word from the respective row (e.g., via the bit-read signals (not shown)). As described in greater detail herein, the memory circuit 50 also includes an enable signal EN (e.g., from an external processor) during a read operation to facilitate reading the requested memory word from the memory array 52.

In the example of FIG. 2, the write-through detection system 58 includes a comparator 64 is configured to likewise receive the write address signal $ADDR_W$ and the read address signal $ADDR_R$. The comparator 64 can be configured as a digital comparator to compare the write address signal $ADDR_W$ and the read address signal $ADDR_R$. The comparator 64 provides a control signal CTRL as an output having a logic-state that is based on the comparison. In response to the write address signal $ADDR_W$ and the read address signal $ADDR_R$ being equal, the comparator 64 can assert a control signal CTRL. Alternatively, in response to the write address signal $ADDR_W$ and the read address signal $ADDR_R$ being unequal, the comparator 64 can de-assert a control signal CTRL.

The control signal CTRL and the enable signal EN are each provided to a set of logic gates that are arranged as part of the write-through detection system 58. In the example of FIG. 2, the logic gates include a first AND-gate 66 that is configured to perform a logic-AND operation on the enable signal EN and the inverted control signal CTRL to generate the read enable signal R-EN. Therefore, while the control signal CTRL is de-asserted based on an unequal condition between the write address signal $ADDR_W$ and the read address signal $ADDR_R$, the read enable signal R-EN is provided to the read address decoder 60 to enable the read address decoder 60 to generate the word-read signal WLR in response to the read address signal $ADDR_R$. However, in response to the control signal CTRL being asserted based on the write address signal $ADDR_W$ and the read address signal $ADDR_R$ being equal, the read enable signal R-EN is de-asserted to deactivate the read address decoder 60. As a result, the read address decoder ceases to produce the word-read signal WLR associated with the respective row in the array portion 54 in response to the read address signal $ADDR_R$.

In addition, the logic gates include a second AND-gate 68 that is configured to perform a logic-AND operation on the enable signal EN and the control signal CTRL to generate the write-through signal W-T. Therefore, while the control signal CTRL is de-asserted based on an unequal condition between the write address signal $ADDR_W$ and the read address signal $ADDR_R$, the write-through signal W-T is de-asserted, and thus the analog bypass portion 56 is deactivated. However, in response to the control signal CTRL being asserted based on the write address signal $ADDR_W$ and the read address signal $ADDR_R$ being equal, the write-through signal W-T is asserted to activate the analog bypass portion 56. As a result, the requested memory word can be read from the analog bypass portion via the bit-write signals BLW, as opposed to from the respective row corresponding to the read address signal $ADDR_R$. Thus, the data states of the bit-write signals BLW can collectively correspond to the output data $DATA_{OUT}$, such as provided to the sense amplifier (not shown), as read from the activated analog bypass portion 56. Accordingly, reading the memory word from the analog bypass portion 56 concurrently with the same memory word being written to the array portion 54 can provide for a more rapid manner of accessing the data from the memory array 52 in a manner that substantially mitigates errors.

Figure 3:
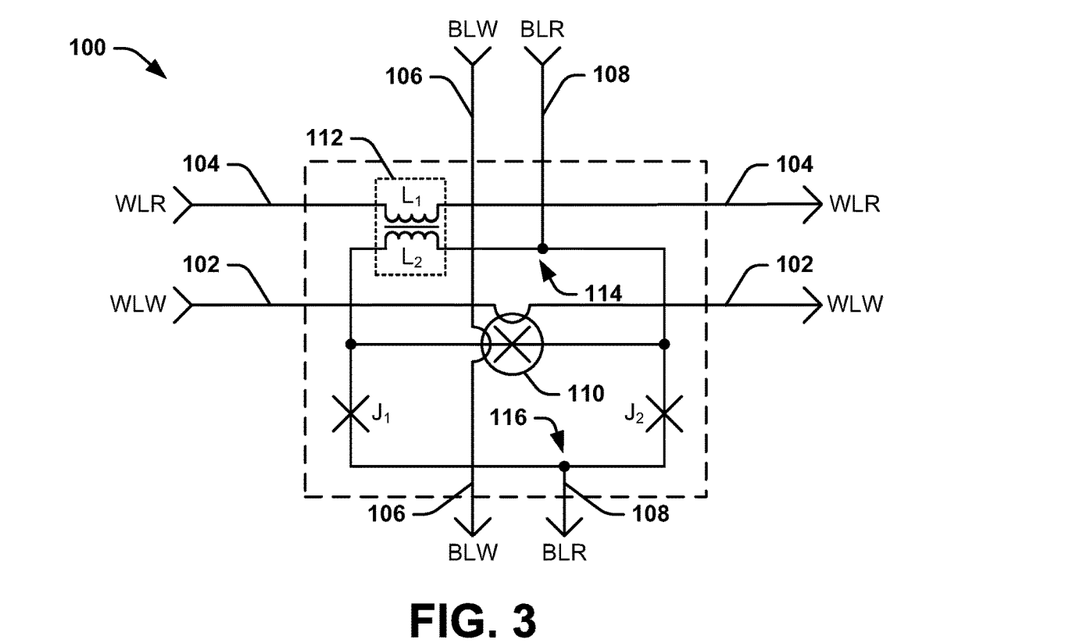
FIG. 3 illustrates an example of a memory cell.

FIG. 3 illustrates an example of a memory cell 100. As an example, the memory cell 100 can correspond to one of a plurality of memory cells that are arranged in the rows and columns of the memory arrays 12 and/or 52. Therefore, reference is to be made to the examples of FIGS. 1 and 2 in the following description of the example of FIG. 3.

The memory cell 100 includes a word-write line 102 and a word-read line 104 that each pass through the memory cell 100. The word-write line 102 conducts a word-write signal WLW during a write operation and the word-read line 104 conducts a word-read signal WLR during a read operation.

As an example, the word-write signal WLW and the word-read signal WLR can each be provided as a current. For example, the word-write signal WLW can correspond to a word-write signal associated with a row of memory cells in the array portion 54 of the memory array 52, and the word-read signal WLR can correspond to a word-read signal associated with the row of memory cells in the array portion 54 of the memory array 52. For example, the word-write and word-read lines 102 and 104 can likewise be coupled to adjacent memory cells in a given row on either side of the memory cell 100. Thus, the word-write signal WLW and the word-read signal WLR propagate through all of the memory cell systems in the row, including the memory cell 100, during the respective write and read operations.

Similarly, the memory cell 100 includes a bit-write line 106 and a bit-read line 108 that each pass through the memory cell 100. The bit-write line 106 conducts a bit-write signal BLW during the write operation and the bit-read line 108 conducts a bit-read signal BLR during the read operation. As an example, the bit-write signal BLW and the bit-read signal BLR can each be provided as a current. For example, the bit-write signal BLW can correspond to a bit-write signal associated with a column of memory cells in the array portion 54 of the memory array 52, and the bit-read signal BLR can correspond to a bit-read signal associated with the column of memory cells in the array portion 54 of the memory array 52. In a similar manner, the second write and second read lines 106 and 108 can likewise be coupled to adjacent memory cells in a given column above and below the memory cell 100. Thus, the bit-write signal BLW and the bit-read signal BLR propagate through all of the memory cell systems in the column, including the memory cell 100, during the respective write and read operations. As an example, the bit-read line 108 associated with each of the memory cells 100 in a given column can be coupled to the sense amplifier 22, such that the sense amplifier 22 can read the logic-state of the memory cell 100 during a read operation.

The memory cell 100 also includes a superconducting hysteretic memory element, demonstrated in the example of FIG. 3 as a phase hysteretic magnetic Josephson junction (PHMJJ) 110, that is configured to store a digital state corresponding to one of the binary logic-1 state or the binary logic-0 state. As an example, the PHMJJ 110 can include ferromagnetic materials in associated barriers to be configured as a switchable it-junction. The memory cell 100 also includes a first Josephson junction $J_1$ and a second Josephson junction $J_2$ that are arranged in parallel with the PHMJJ 110, and which collectively form a superconducting quantum interference device (SQUID). As an example, the Josephson junctions $J_1$ and $J_2$ can be configured as superconductor-ferromagnetic-superconductor (SFS) Josephson junctions. The PHMJJ 110 can include outer layers of superconducting material, such as Niobium (Nb), and one or more internal thin film layers of ferromagnetic materials. As an example, the thin film layers of ferromagnetic materials can include one or more "hard" ferromagnetic layers having a substantially fixed magnetic field and one or more "soft" ferromagnetic layers that can be changed as a result of magnetic fields generated locally by orthogonal electrical currents. Furthermore, the PHMJJ 110 can include one or more additional layers, such as oxide layers, that are interleaved with the superconducting and/or ferromagnetic layers.

In the example of FIG. 3, the word-write line 102 and the bit-write line 106 are demonstrated as magnetically coupled to the PHMJJ 110, as indicated at 106. As an example, the PHMJJ 110 can include two or more different ferromagnetic layers, and the orientation of the magnetic field in one of the ferromagnetic layers is substantially fixed. The magnetic field orientation of the other one or more ferromagnetic layers can be changed as a result of magnetic fields that are generated locally by the word-write signal WLW and the bit-write signal BLW.

Therefore, based on the configuration of the PHMJJ 110, the word-write signal WLW and the bit-write signal BLW can generate the magnetic field to set the digital state of the PHMJJ 110 to a binary logic-1 state or a binary logic-0 state using magneto-current states of the PHMJJ 110 based on the respective directions of signal propagation during a write operation. As one example, if the combined magnetic field produced by the word-write signal WLW and the bit-write signal BLW has the same orientation as the internal magnetic field of the hard ferromagnetic layers, the individual magnetic fields of each of the word-write signal WLW and the bit-write signal BLW can add together positively or negatively to set the digital state of the phase hysteretic magnetic Josephson junction to correspond to a binary logic-1 state or a binary logic-0 state respectively. However, if the combined magnetic field produced by the word-write signal WLW and the bit-write signal BLW has the opposite orientation as the internal magnetic field of the hard ferromagnetic layers, the digital state of the PHMJJ 110 remains unchanged. As another example, the word-write signal WLW and the bit-write signal BLW can be applied as a sequence of write signal pulses, such that if the word-write signal WLW overlaps in time with the bit-write signal BLW, the digital state of the PHMJJ 110 can correspond to a binary logic-1 state or a binary logic-0 state. However, if only one such pulse is present at a given time, or if the word-write signal and bit-write signal WLW and WLR do not sufficiently overlap in time, the digital state of the PHMJJ 110 can remain unchanged.

Similarly, the individual magnetic field of only one of the word-write signal WLW and the bit-write signal BLW may be insufficient to change the digital state of the PHMJJ 110, such that memory cells in unaddressed rows maintain their respective digital states despite the propagation of the bit-write signal BLW. Furthermore, based on the superconductivity of the word-write line 102 and the bit-write line 106 and the presence of a superconducting ground plane, cross coupling between the word-write line 102 and the bit-write line 106 can be substantially mitigated. Therefore, for a given propagation direction of the word-write signal WLW in a given row, the propagation directions of the respective bit-write signals BLW in each of the columns can be controlled to set the digital state of each of the PHMJJs 102 in a given row during a write operation without affecting the digital states in any of the memory cells in any of the other rows through which a word-write signal WLW is not provided.

In the example of FIG. 3, the memory cell 100 includes a transformer 112 that includes a primary winding $L_1$ on the word-read line 104 through which the word-read signal WLR propagates. The transformer 112 also includes a secondary winding $L_2$ inductively coupled to the primary winding $L_1$ and arranged in parallel with the PHMJJ 110 and with the Josephson junctions $J_1$ and $J_2$. Therefore, the word-read signal WLR is inductively provided to the Josephson junctions $J_1$ and $J_2$. The bit-read line 108 is coupled to a node 114 that is coupled to the secondary winding $L_2$, such that the bit-read signal BLR enters the memory cell 100 at the node 114, and is coupled to a node 116 corresponding to an output of the memory cell 100 between the Josephson junctions $J_1$ and $J_2$, such that the bit-read signal BLR exits the memory cell 100 from the node 114.

The digital state of the PHMJJ 110 can be read from the memory cell 100 in response to the word-read signal WLR and the bit-read signal BLR. Specifically, the word-read signal WLR can be provided on the word-read line 104 to select the row of memory cells in the associated memory array 52. As an example, the word-read signal WLR propagates through the primary winding $L_1$ of the transformer 112 as a DC current pulse. The DC current pulse of the word-read signal WLR is inductively provided to the PHMJJ 110 and the Josephson junctions $J_1$ and $J_2$. Therefore, the current induced by the word-read signal WLR via the secondary winding $L_2$ is added to the bit-read signal BLR based on the direction of propagation of the word-read signal WLR. The stored binary digital state of the PHMJJ 110 can be determinative of the critical current necessary to trigger the Josephson junctions $J_1$ and $J_2$ based on the superconducting phase that can be provided by the PHMJJ 110.

For example, if the PHMJJ 110 is in a zero state, and thus stores a logic-0 binary state, the PHMJJ 110 is in a substantially minimum Josephson energy ground state that does not provide superconducting phase. Therefore, the added magnitude of the bit-read signal BLR and the word-read signal WLR, as induced to the Josephson junctions $J_1$ and $J_2$, is not sufficient to trigger the Josephson junctions $J_1$ and $J_2$. Accordingly, a voltage on the bit-read line 108 can remain at a substantially decreased magnitude (e.g., zero volts) to indicate the logic-0 state. However, as another example, if the PHMJJ 110 is in a π-state, and thus stores a logic-1 binary state, the PHMJJ 110 has a substantially maximum Josephson energy and provides a superconducting phase that is added to the magnitude of the bit-read signal BLR and the word-read signal WLR. Therefore, the contribution of the superconducting phase, the bit-read signal BLR, and the word-read signal WLR, as induced to the Josephson junctions $J_1$ and $J_2$, is sufficient to trigger the Josephson junctions $J_1$ and $J_2$. Accordingly, the Josephson junctions $J_1$ and $J_2$ can trigger in an oscillatory manner to increase the voltage on the bit-read line 108 to indicate the logic-1 state.

The memory cell 100 is demonstrated as but one example of a memory cell that can be provided in the memory arrays 12 and/or 52, as described herein. While the memory cell 100 demonstrates a superconducting hysteretic memory element that is configured as a PHMJJ, it is to be understood that other types of superconducting hysteretic memory elements can instead be implemented in the memory arrays 12 and/or 52, such as can operate in different ways. Additionally, it is to be understood that the memory arrays 12 and/or 52 are not limited to including superconducting hysteretic memory elements, but can instead implement non-superconducting hysteretic memory elements. Therefore, the memory arrays 12 and/or 52 can be configured with memory cells of any of a variety of different configurations.

Figure 4:
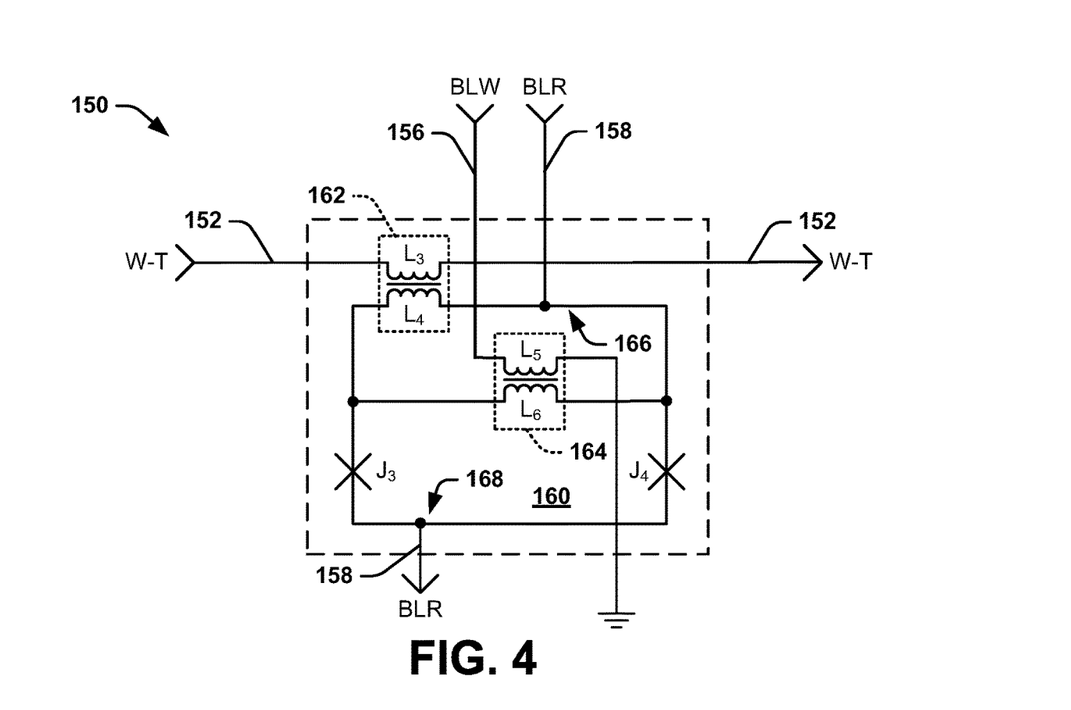
FIG. 4 illustrates an example of an analog bypass cell.

FIG. 4 illustrates an example of an analog bypass cell 150. As an example, the analog bypass cell 150 can correspond to one of a plurality of analog bypass cells that are arranged in a row of the analog bypass portion 16 and/or 56 of the respective memory arrays 12 and/or 52. As an example, the analog bypass cell 150 can be included the in same memory array 12 and/or 52 in which the memory cell 100 is included. Therefore, reference is to be made to the examples of FIGS. 1 and 2 in the following description of the example of FIG. 4.

The analog bypass cell 150 includes a write-through line 152 that passes through the analog bypass cell 150. The write-through line 152 conducts a write-through signal W-T, such as generated by the write-through detection system 28 in the example of FIG. 1 or the second AND-gate 68 in the example of FIG. 2. As an example, the write-through signal W-T can be provided to the analog bypass cell 150 in response to the write-through detection system 28 and/or 58 detecting that the write address and the read address (e.g., the write address signal $ADDR_W$ and the read address signal $ADDR_R$) are equal. For example, the write-through signal W-T can be provided as a current. As an example, the write-through line 152 can be coupled to adjacent analog bypass cells in the analog bypass portion 16 and/or 56 on either side of the analog bypass cell 150. Thus, the write-through signal W-T propagates through all of the analog bypass cells in the analog bypass portion 16 and/or 56, including the analog bypass cell 150. Therefore, the write-through signal W-T can be provided to activate the analog bypass portion 16 and/or 56 to facilitate the memory word to be read from the analog bypass portion 16. Accordingly, the write-through signal W-T is provided through the analog bypass cell 150 to facilitate reading a single bit (e.g., a logic-state of the single bit) of the memory word from the analog bypass cell 150.

The analog bypass cell 150 also includes a bit-write line 156 and a bit-read line 158 that each pass through the analog bypass cell 150. As an example, the bit-write line 156 and the bit-read line 158 can correspond to the bit-write line 106 and the bit-read line 108 in the example of FIG. 3. For example, the analog bypass portion 16 and/or 56 can form a row of the respective memory array 12 and/or 52, such as a last row (e.g., on a "bottom" of the memory array 12 and/or 52 opposite the column peripheral circuit 20). Therefore, the bit-write line 156 and the bit-read line 158 can extend through each of the memory cells 100 in a given column and through the analog bypass cell 150. As an example, the bit-read line 158 can be coupled to the sense amplifier 22, such that the sense amplifier 22 can be configured to read the memory word from the analog bypass portion 16 and/or 56 based on reading each bit of the memory word from a respective one of the analog bypass cells 150.

The analog bypass cell 150 also includes a superconducting read element, demonstrated in the example of FIG. 4 as a SQUID 160. In the example of FIG. 4, the analog bypass cell 150 includes a first Josephson junction $J_3$ and a second Josephson junction $J_4$. The Josephson junctions $J_3$ and $J_4$ are arranged in parallel with a first transformer 162 that includes a primary winding $L_3$ and a secondary winding $L_4$ and a second transformer 164 that includes a primary winding $L_5$ and a secondary winding $L_6$. As an example, the Josephson junctions $J_3$ and $J_4$ can be configured as superconductor-ferromagnetic-superconductor (SFS) Josephson junctions. The Josephson junctions $J_3$ and $J_4$ and the secondary windings $L_4$ and $L_6$ thus form the SQUID 160. As described herein, the SQUID 160 can be implemented to read a bit of the memory word from the analog bypass portion 16 and/or 56. Because the analog bypass cell 150 includes a SQUID 160 that does not include a PHMJJ, as opposed to the memory cell 100, the analog bypass cell 150 can be fabricated in a much more compact and simplistic manner than the memory cells 100.

In the example of FIG. 4, the primary winding $L_3$ is arranged on the write-through line 152 through which the write-through signal W-T propagates. Therefore, the write-through signal W-T is inductively provided to the Josephson junctions $J_3$ and $J_4$. Similarly, in the example of FIG. 4, the primary winding $L_5$ is arranged on the bit-write line 156 through which the bit-write signal BLW propagates. Therefore, the bit-write signal BLW is likewise inductively provided to the Josephson junctions $J_3$ and $J_4$. In the example of FIG. 4, the bit-write line 156 is demonstrated as grounded after the primary winding $L_5$. However, this is based on the example of the analog bypass cell 150 being arranged at the "bottom" of the memory array 12 and/or 52, and the bit-write line 156 could instead be coupled to or be configured as the bit-write line 106 of additional memory cells 100 in the associated column based on the analog bypass portion 16 and/or 56 corresponding to a different row (e.g., top or elsewhere) in the memory array 12 and/or 52. The bit-read line 158 is coupled to a node 166 that is coupled to the secondary windings $L_4$ and $L_6$, such that the bit-read signal BLR enters the analog bypass cell 150 at the node 166, and is coupled to a node 168 corresponding to an output of the analog bypass cell 150 between the Josephson junctions $J_3$ and $J_4$, such that the bit-read signal BLR exits the analog bypass cell 150 from the node 166. As described previously, the node 166 can be coupled to the sense amplifier 22, such that the bit-read signal BLR can be read by the sense amplifier 22.

The digital state of the bit-write signal BLW can be read via the SQUID 160 in response to the bit-write signal BLW and the write-through signal W-T. Specifically, the write-through signal W-T can be provided on the write-through line 152 to select the analog bypass portion 16 and/or 56 in the associated memory array 52. The write-through signal W-T propagates through the primary winding $L_3$ of the first transformer 162 as a DC current pulse. The DC current pulse of the write-through signal W-T is inductively provided to the Josephson junctions $J_3$ and $J_4$. As an example, the bit-write line BLW can have a positive amplitude to indicate a logic-1 state, and can have a zero amplitude to indicate a logic-0 state. Therefore, if the bit-write line BLW has a zero amplitude, as induced to the Josephson junctions $J_3$ and $J_4$, and thus a logic-0 state, the added amplitude of the write-through signal W-T, as induced to the Josephson junctions $J_3$ and $J_4$, is not sufficient to trigger the Josephson junctions $J_3$ and $J_4$. Accordingly, a voltage on the bit-read line 158 at the node 168 can remain at a substantially decreased magnitude (e.g., zero volts) to indicate the logic-0 state. However, as another example, if the bit-write line BLW has a positive amplitude, as induced to the Josephson junctions $J_3$ and $J_4$, and thus a logic-1 state, the added amplitude of the write-through signal W-T, as induced to the Josephson junctions $J_3$ and $J_4$, is sufficient to trigger the Josephson junctions $J_3$ and $J_4$. Accordingly, the Josephson junctions $J_3$ and $J_4$ can trigger in an oscillatory manner to increase the voltage on the bit-read line 158 at the node 168 to indicate the logic-1 state.

Accordingly, the analog bypass cell 150 demonstrates a manner of reading the memory word that is concurrently being written to a row in the array portion 14 and/or 54 (e.g., via the bit-write signals BLW). Particularly, in response to activation of the analog bypass portion 16 and/or 56 via the write-through signal W-T, the respective bit of the memory word that is being written to the row corresponding to the write address signal $ADDR_W$ can be read from the analog bypass cell 150 via the respective bit-write signal BLW. In other words, as an example, because the bit-write signal BLW corresponds to the respective bit of the memory word that is written to the row corresponding to the write address signal $ADDR_W$, the bit-write signal BLW can likewise be read directly from the analog bypass cell 150 (e.g., via the write-through signal W-T) as the bit-write signal BLW propagates through the memory array 12 and/or 52 from the memory cells (e.g., the memory cells 100) in the column to the analog bypass cell 150. Accordingly, the memory word can be read from the memory array 12 and/or 52 substantially concurrently with the writing of the memory word to the memory array 12 and/or 52 in a manner that substantially mitigates the risk of timing errors that can affect the integrity of the memory word. As a result, the memory circuit 10 can operate in a much quicker and more efficient manner by not being required to wait until conclusion of a write operation before initiating a read operation based on allowing a data word to be read from the memory array 12 and/or 52 concurrently with the same data word being written to the memory array 12 and/or 52.

Figure 5:
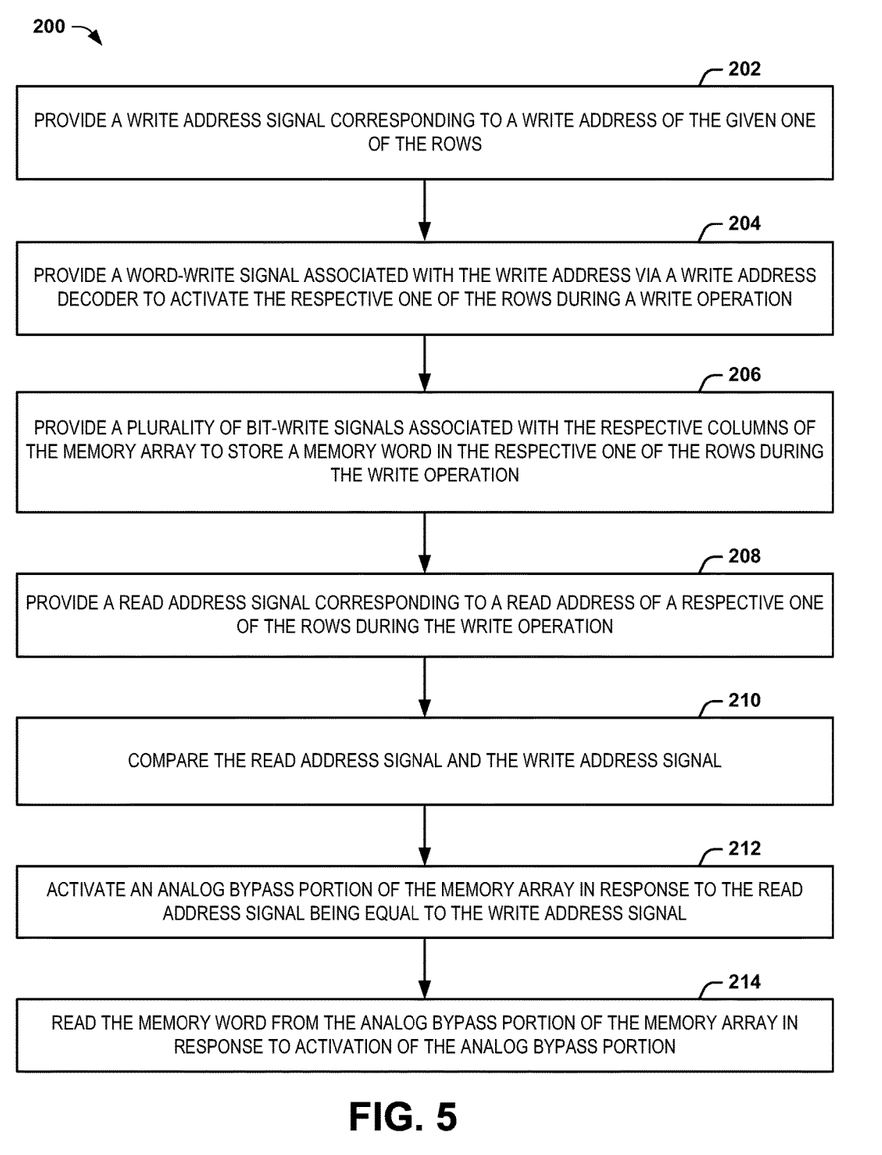
FIG. 5 illustrates an example of a method for reading data from a memory array during a write operation.

In view of the foregoing structural and functional features described above, a method in accordance with various aspects of the present disclosure will be better appreciated with reference to FIG. 5. While, for purposes of simplicity of explanation, the method of FIG. 5 is shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a method in accordance with an aspect of the present disclosure.

FIG. 5 illustrates a method 200 for reading data from a memory array (e.g., the memory array 12) during a write operation, the memory array comprising rows and columns of memory cells (e.g., the memory cell 100). At 202, a write address signal (e.g., the write address signal $ADDR_W$) corresponding to a write address of the given one of the rows is provided. At 204, a word-write signal (e.g., the word-write signal WLW) associated with the write address is provided via a write address decoder (e.g., the write address decoder 24) to activate the respective one of the rows during a write operation. At 206, a plurality of bit-write signals (e.g., the bit-write signals BLW) associated with the respective columns of the memory array are provided to store a memory word in the respective one of the rows during the write operation. At 208, a read address signal (e.g., the read address signal $ADDR_R$) corresponding to a read address of a respective one of the rows is provided during the write operation. At 210, the read address signal and the write address signal are compared. At 212, an analog bypass portion (e.g., the analog bypass portion 16) of the memory array is activated in response to the read address signal being equal to the write address signal. At 214, the memory word is read from the analog bypass portion of the memory array in response to activation of the analog bypass portion.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A memory circuit comprising:
a memory array comprising an array portion and an analog bypass portion, the array portion comprising rows and columns of memory cells, the array portion stores a respective memory word in a given one of the rows in response to a word-write signal corresponding to a write address of the given one of the rows and in response to a plurality of bit-write signals associated with the plurality of columns, and to read a respective memory word from the given one of the rows or from another one of the rows in response to a word-read signal corresponding to a read address of the given one or the other one of the rows and in response to a plurality of bit-read signals associated with the plurality of columns; and a write-through detection system that activates the analog bypass portion to read the memory word from the analog bypass portion in response to the read address being the same as the write address.

2. The circuit of claim 1, wherein the array portion stores the respective memory word during a write operation and reads the respective memory word during a read operation, wherein the write-through detection system activates the analog bypass portion to read the plurality of bit-write signals corresponding to the memory word in response to the read address being the same as the write address during the write operation.

3. The circuit of claim 1, further comprising a row peripheral circuit that receives a write address signal corresponding to the write address of the given one of the rows and generates the word-write signal to activate the given one of the rows to write the memory word during a write operation, the row peripheral circuit also receiving a read address signal corresponding to the read address of the given one or the other one of the rows and generates the word-read signal to activate the given one or the other one of the rows to read the memory word during a read operation.

4. The circuit of claim 3, wherein the write-through detection system is to compare the write address signal and the read address signal and to activate the analog bypass portion to read the plurality of bit-write signals corresponding to the memory word in response to the write address signal addressing the same memory row as the read address signal during the write operation.

5. The circuit of claim 1, wherein the write-through detection system receives a read-enable signal during a read operation, wherein the memory array reads the memory word from the given one of the rows or the analog bypass portion in response to the word-read signal and the read-enable signal.

6. The circuit of claim 5, further comprising a read address decoder that generates the word-read signal to select the given one of the rows to read the memory word from the given one of the rows, wherein the write-through detection system comprises logic to deactivate the read address decoder and to activate the analog bypass portion in response to the read-enable signal and in response to the read address being the same as the write address.

7. The circuit of claim 6, wherein the write-through detection system comprises a comparator that compares the write address and the read address and to generate a control signal in response to the write address being the same as the read address, wherein the logic deactivates the read address decoder and to activate the analog bypass portion in response to the read-enable signal and the control signal.

8. The circuit of claim 7, wherein the logic comprises:
a first AND-gate that receives the read-enable signal and an inverted state of the control signal and generates an array-enable signal to activate and deactivate the read address decoder; and
a second AND-gate that receives the read-enable signal and the control signal and generates a write-through signal to activate and deactivate the analog bypass portion.

9. The circuit of claim 1, wherein the analog bypass portion comprises a row of cells coupled to the memory array, each of the cells of the analog bypass portion being arranged to provide an output bit corresponding to a respective one of the plurality of bit-read signals in response to activation of the analog bypass portion via a write-through signal.

10. The circuit of claim 9, wherein each of the cells of the analog bypass portion comprises:
a superconducting quantum interference device (SQUID) that provides an output signal having a logic-state corresponding to a logic-state associated with the respective one of the plurality of bit-write signals;
a first transformer coupled to the SQUID to inductively couple the write-through signal to the SQUID as a bias; and
a second transformer coupled to the SQUID to inductively couple the respective one of the plurality of bit-write signals to the SQUID, such that the SQUID provides the output signal in response to the write-through signal and the respective one of the plurality of bit-write signals.

11. The circuit of claim 1, wherein each of the memory cells of the memory array comprises a superconducting hysteretic memory element to store an associated logic state in response to the word-write signal and a respective one of the plurality of bit-write signals.

12. The circuit of claim 1, wherein the plurality of bit-read signals propagate on a respective plurality of bit-read lines that extend through each of the rows of the array portion of the memory array and through the analog bypass portion of the memory array, the system further comprising a sense amplifier coupled to the plurality of bit-read lines to read the memory word.

13. A method for reading data from a memory array during a write operation, the memory array comprising rows and columns of memory cells, the method comprising:
providing a write address signal corresponding to a write address of given one of the rows;
providing a word-write signal associated with the write address via a write address decoder to activate the given one of the rows during a write operation;
providing a plurality of bit-write signals associated with respective columns of the memory array to store a memory word in the given one of the rows during the write operation;
providing a read address signal corresponding to a read address of the given one of the rows or another one of the rows during the write operation;
comparing the read address signal and the write address signal;
activating an analog bypass portion of the memory array in response to the read address signal being the same as the write address signal; and
reading the memory word from the analog bypass portion of the memory array in response to activation of the analog bypass portion.

14. The method of claim 13, wherein reading the memory word comprises:
generating a write-through signal in response to the read address signal addressing the same memory row as the write address signal; and
reading the plurality of bit-write signals from the analog bypass portion of the memory array.

15. The method of claim 13, further comprising providing a read-enable signal during the write operation, wherein comparing the read address signal and the write address signal comprises generating a control signal to indicate that the read address signal is the same as the write address signal, wherein activating the analog bypass portion comprises:

deactivating a read address decoder in response to the control signal and the read-enable signal, wherein the read address decoder generates a word-read signal to select a given one of the rows to read a respective memory word from the given one of the rows during a read operation; and     providing a write-through signal in response to the control signal and the read-enable signal to activate the analog bypass portion of the memory array.

16. The method of claim 13, wherein providing the plurality of bit-write signals comprises providing the plurality of bit-write signals associated with the respective columns of the memory array to store the memory word in a superconducting hysteretic memory element in each of the memory cells of the given one of the rows, and wherein reading the memory word comprises reading the memory word from a superconducting read element in each of a plurality of cells associated with the analog bypass portion of the memory array.

17. A memory circuit comprising:

a memory array comprising an array portion and an analog bypass portion, the array portion comprising rows and columns of memory cells, each of the memory cells comprising a superconducting hysteretic memory element and each of a plurality of cells of the analog bypass portion comprising a superconducting read element, the array portion storing a respective memory word in a given one of the rows in response to a word-write signal corresponding to a write address of the given one of the rows and in response to a plurality of bit-write signals associated with the plurality of columns, and to read a respective memory word from the given one of the rows or from another one of the rows in response to a word-read signal corresponding to a read address of the given one or the other one of the rows and in response to a plurality of bit-read signals associated with the plurality of columns; and     a write-through detection system that activates the analog bypass portion to read the plurality of bit-write signals corresponding to the memory word from the analog bypass portion in response to the read address being the same as the write address.

18. The circuit of claim 17, wherein the array portion stores the respective memory word during a write operation and reads the respective memory word during a read operation, wherein the write-through detection system activates the analog bypass portion to read the plurality of bit-write signals corresponding to the memory word in response to the read address being the same as the write address during the write operation.

19. The circuit of claim 17, wherein the write-through detection system compares a write address signal corresponding to the respective one of the plurality of rows and the read address signal corresponding to the respective one of the rows and activates the analog bypass portion to read the plurality of bit-write signals corresponding to the memory word in response to the write address signal addressing the same memory row as the read address signal during the write operation.

20. The circuit of claim 17, wherein the superconducting read element of each of the plurality of cells of the analog bypass portion is arranged as a superconducting quantum interference device (SQUID) that provides an output signal having a logic-state corresponding to a logic-state associated with the respective one of the plurality of bit-write signals, wherein each of the plurality of cells of the analog bypass portion comprises a transformer coupled to the SQUID to inductively couple the respective one of the plurality of bit-write signals to the SQUID to provide the output signal in response to a write-through signal that activates the analog bypass portion.

\* \* \* \* \*